(12) United States Patent
Chen et al.

(10) Patent No.: US 8,692,333 B2
(45) Date of Patent: Apr. 8, 2014

(54) SEMICONDUCTOR DEVICE FOR WORD LINE DRIVER WITH EFFICIENT ROUTING OF CONDUCTOR FOR DECREASED GATE RESISTANCE

(75) Inventors: Yen-Huei Chen, Jhudong Township, Hsinchu County (TW); You-Cheng Xiao, Taiping (TW); Jung-Hsuan Chen, Hsinchu (TW); Shao-Yu Chou, Chu Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 811 days.

(21) Appl. No.: 12/855,004

(22) Filed: Aug. 12, 2010

(65) Prior Publication Data

US 2012/0037997 A1 Feb. 16, 2012

(51) Int. Cl.
*H01L 29/76* (2006.01)

(52) U.S. Cl.
USPC ............ 257/369; 257/206; 257/296; 257/758

(58) Field of Classification Search
USPC .......... 257/369, 393, 758, 296, 202–211, 266
See application file for complete search history.

(56) References Cited

U.S. PATENT DOCUMENTS

| | | |
|---|---|---|
| 6,787,800 B2 | 9/2004 | Weiland et al. |
| 2004/0174730 A1* | 9/2004 | Takashima ................... 365/145 |

* cited by examiner

*Primary Examiner* — Marcos D. Pizarro
*Assistant Examiner* — Tifney Skyles
(74) *Attorney, Agent, or Firm* — Duane Morris LLP

(57) ABSTRACT

A semiconductor device comprises first, second, and third. The first conductor is a gate conductor formed above an oxide region over a substrate and having a contact. The second conductor is coupled to the contact and extends across a width of the oxide region. The second conductor has a lower resistance than the gate conductor. The third conductor is a word line conductor. The second conductor is routed to not intersect the word line conductor.

20 Claims, 3 Drawing Sheets

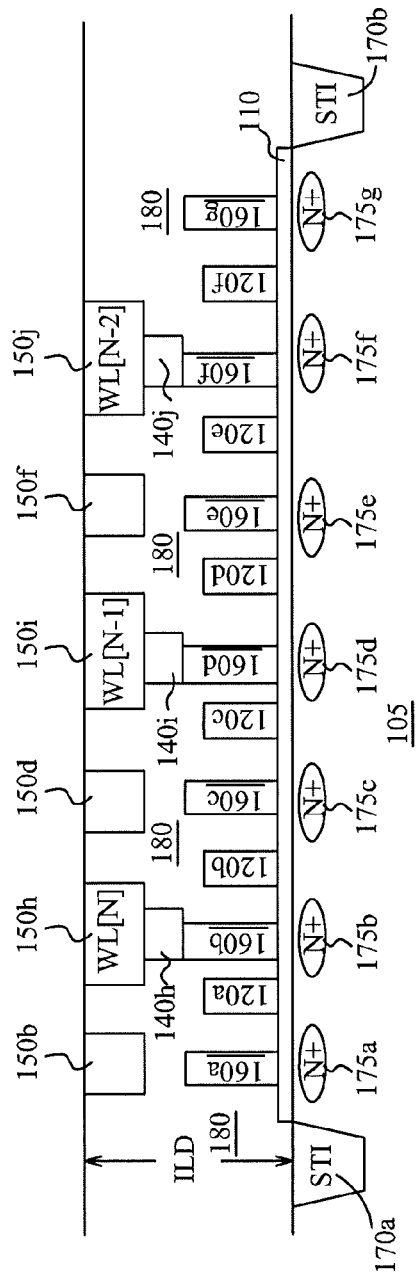
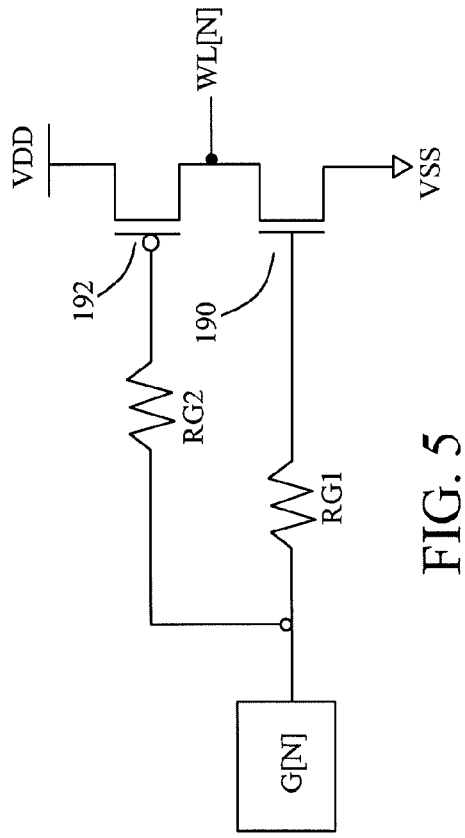
FIG. 4
FIG. 5

SEMICONDUCTOR DEVICE FOR WORD LINE DRIVER WITH EFFICIENT ROUTING OF CONDUCTOR FOR DECREASED GATE RESISTANCE

BACKGROUND

Designers of memory circuits have moved to gate dielectric materials having a high dielectric constant, e.g., metals such as hafnium, for implementation of gates in metal oxide semiconductor (MOS) transistors. As transistor dimensions decrease, gate resistance becomes a challenge. For example, gate resistance is higher, e.g., by almost a factor of three, in 20 nm nodes relative to 28 nm nodes. Such increased gate resistance is due to a reduced channel length, which may be, e.g., 18 nm. Wide oxide definition (OD) transistors experience increased gate delay due to such increased resistance, because gate delay is proportional to resistance. Oxide definition refers to definition of diffusion areas such as source, drain and interconnect.

Increased gate delay causes slower timing performance in circuitry, e.g., word line drivers in static random access memory (SRAM) memory circuits. A word line driver, which may be an inverter circuit, may have a high loading, which requires a large physical device. A known word line driver has a short channel length and a relatively wide oxide definition region, which corresponds to a relatively long distance between a gate and a PMOS region of the word line driver. The wide oxide definition region corresponds to a long poly gate, which leads to increased gate resistance, because a large parasitic resistance is formed in the poly gate at the PMOS region and also at an NMOS region of the inverter between a gate region and the PMOS region. As the width of the OD region increases (i.e., as the distance between the gate region and the PMOS region increases in order to support increased loading), gate resistance increases, slowing circuit performance.

BRIEF DESCRIPTION OF THE DRAWINGS

The following will be apparent from elements of the figures, which are provided for illustrative purposes and are not necessarily to scale.

FIG. 4 is a third cross-sectional view, taken along section line 4-4 of FIG. 1, of a word line driver layout in accordance with some embodiments.

FIG. 5 is a circuit schematic corresponding to a word line driver in accordance with some embodiments.

DETAILED DESCRIPTION

Figure 1:
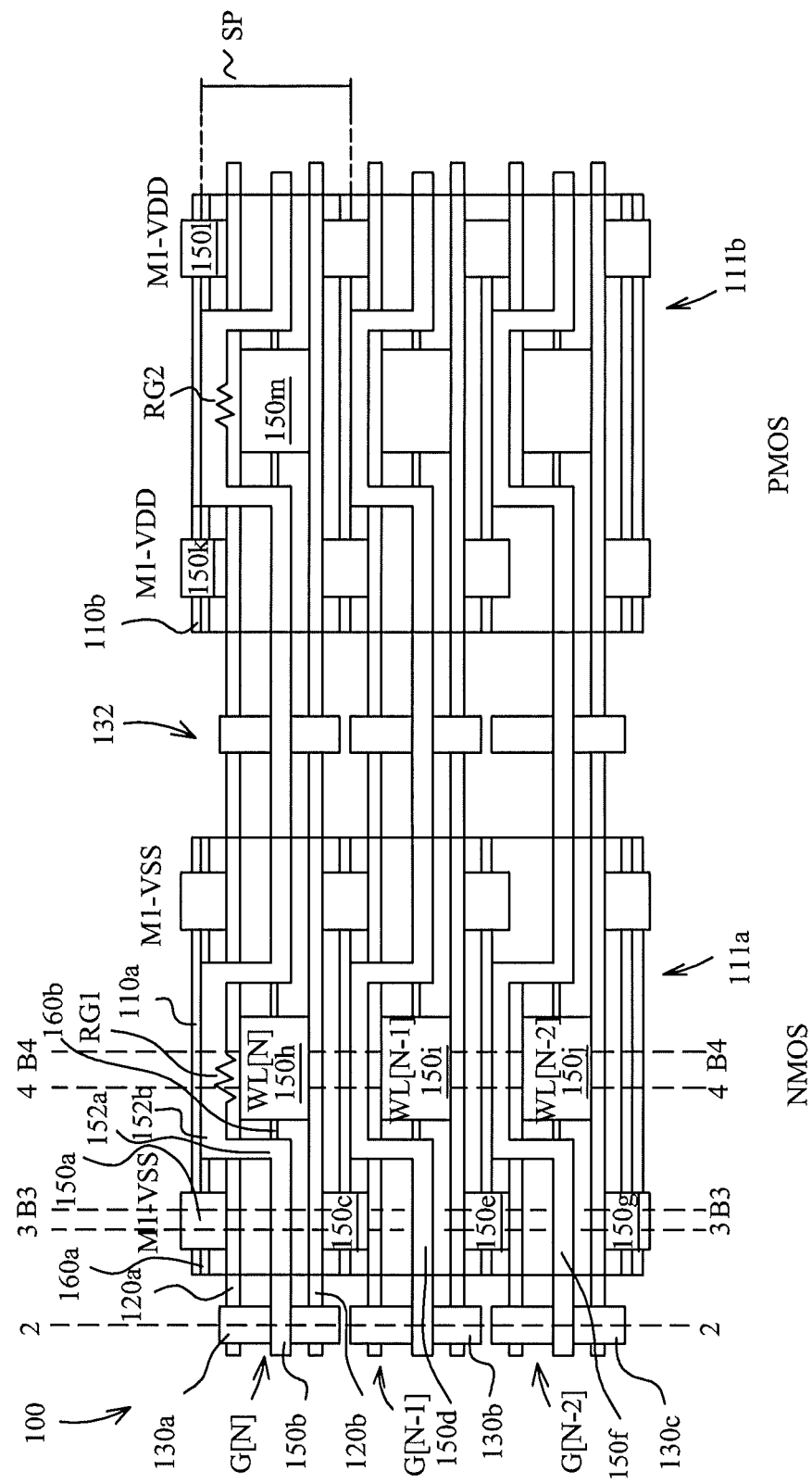
FIG. 1 is a top (plan) view of a word line driver layout in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "vertically," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1 is a top (plan) view of a word line driver layout in accordance with one embodiment. A word line (WL) driver 100 includes an NMOS oxide region 110a (also referred to as an oxide definition region) and a PMOS oxide region 110b. The oxide regions 110a, 110b are formed by providing an oxide layer above the substrate and selectively removing (e.g., by wet etch or dry etch) material around the oxide regions. The term "oxide region 110" may be used when referring to either of the regions without distinction. The NMOS OD region 110a and the various regions associated with the NMOS on the left side of FIG. 1 are collectively referred to as NMOS region 111a; similarly, the PMOS OD region and various regions at the right side of FIG. 1 are referred to as PMOS region 111b.

Three word lines WL[N], WL[N-1], and WL[N-2] are shown in this example, but other numbers of word lines may be used. An SRAM pitch SP is shown in FIG. 1 corresponding to word line WL[N]. Gate contacts corresponding to word lines WL[N], WL[N-1], and WL[N-2] are denoted G[N], G[N-1], and G[N-2], respectively. Various numbers of gate contacts may be used, depending on the number of gate conductors 120a, 120b. Polycrystalline silicon (poly) gate conductors 120a and 120b extend horizontally across the width of the oxide regions 110a and 110b (i.e., extend in a horizontal direction referring to the orientation of FIG. 1). Although gate conductors 120a and 120b are labeled at the left side of FIG. 1 near the gate contacts, one of ordinary skill in the art will understand where the gate conductors extend to other parts of the figure (e.g., at the NMOS and PMOS regions) based on the circuit layout shown in the figure. For clarity and simplicity of illustration, gate conductors corresponding to gate contact G[N] are labeled as 120a and 120b, but gate conductors corresponding to gate contacts G[N-1] and G[N-2] are not labeled in FIG. 1.

Figure 2:
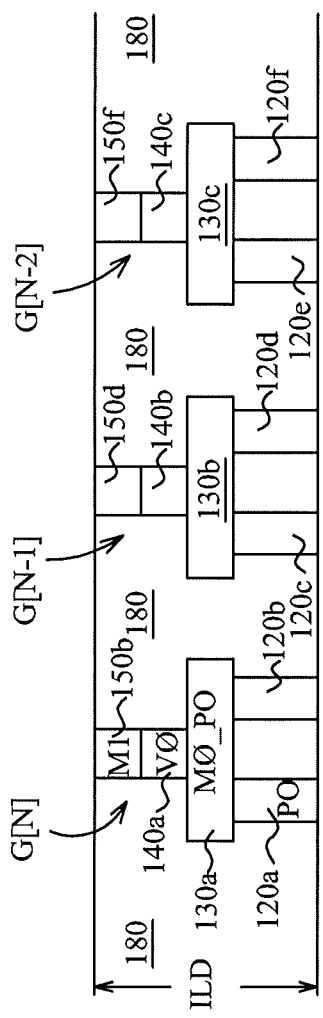
FIG. 2 is a first cross-sectional view, taken along section line 2-2 of FIG. 1, of a word line driver layout in accordance with some embodiments.

Gate contact G[N] also has a conductive pattern or trace 130a in the metal zero (M0) inter-layer dielectric (ILD) layer (also referred to as inter-metal dielectric layer) and a conductive pattern or trace 150b in the metal one (M1) ILD layer. As shown in FIG. 2, word line driver 100 has conductive circuit traces 150d and 150f in the M1 layer, corresponding to gate contacts G[N-1] and G[N-2], respectively.

In some embodiments, circuit trace 150b (and respective circuit traces in the M1 layer corresponding to other gate contacts) is configured in a "zigzag" pattern comprising corners 152a and 152b as shown in FIG. 1. Referring to the example of FIG. 1, "right" refers to the direction towards the PMOS region 111b, and "up" refers to the direction from gate contact G[N-2] to gate contact G[N]. In FIG. 1, a "zigzag" refers to a horizontal rightward section leading to a vertical upward section, which leads to another horizontal rightward section, following a path along M1 layer 150b from left to right in the figure. In various embodiments, different numbers of zigzags may be used in a variety of serpentine patterns. In some embodiments (not shown), a circuit pattern in the M1 layer extends right, then up, then right and up, then right, i.e., two zigzags. In other embodiments, numbers of zigzags greater than 2 are used.

In some embodiments, a circuit pattern in the M1 layer routed around existing patterns 150h, 150i, and 150j in the M1 layer provides a high conductance path to the gate contacts, using the existing M1 layer. Advantageously, this can be accomplished without adding layers or masks to the existing fabrication process. In particular, the lines 150b, 150d, and 150*f* above the NMOS region 111*a* essentially bypass the resistance of the poly overlying the NMOS. The choice of a zigzag pattern routes conductors around WL regions 150*h*, 150*i*, and 150*j* in the M1 layer, in a configuration where the gate contacts G[N], G[N-1], and G[N-2] are horizontally aligned with the patterns 150*h*, 150*i*, and 150*j*. Thus, in various embodiments, the layout of the zigzag pattern depends on what existing patterns around which routing is performed. As shown in FIG. 1, lines 150*b*, 150*d*, and 150*f* are routed around patterns 150*h*, 150*i*, and 150*j*, respectively in a (single) plane, in a same layer (M1 layer) as patterns 150*h*, 150*i*, and 150*j*.

Driver 100 has M1 reference voltage (VSS) regions (M1-VSS regions) 150*a*, 150*c*, 150*e*, and 150*g* at a left side of NMOS region 111*a*; similar M1-VSS regions are shown at a right side of NMOS region 11*b* but are not labeled with reference numerals for simplicity. These M1-VSS regions are conductive regions that provide a specified reference voltage VSS. Driver 100 also has word line (WL) regions 150*h*, 150*i*, and 150*j* corresponding to respective word lines. Metal zero oxide definition (M0_OD) regions 160*a* and 160*b* (M0 oxide regions 160*a* and 160*b*) corresponding to word line WL[N] are shown and labeled in FIG. 1; similar regions are shown but not labeled corresponding to WL[N-1] and WL[N-2]. The metal zero oxide definition (or metal zero oxide) regions are so named because they are coupled to oxide region 110. Parasitic resistances RG1 and RG2 are schematically shown in FIG. 1; the role of these resistances will be described further below.

Some embodiments include a contact 132 between NMOS oxide region 110*a* and PMOS oxide region 110*b* to reduce poly resistance. One contact 132 is labeled in FIG. 1, and similar contacts corresponding to WL[N-1] and WL[N-2] are shown but not labeled in FIG. 2 for simplicity. These contacts may be referred to collectively as contacts 132. Contacts 132 may be configured similarly in terms of layout as gate contacts G[N], G[N-1], and G[N-2], which configuration is described further below in the context of FIG. 2. Various numbers of contacts can be added in various embodiments. By providing at least one contact between NMOS region 111*a* and PMOS region 111*b*, some embodiments decrease an effective gate resistance of word line driver 100 by decreasing a gate resistance for PMOS region 111*b*. Contact 132 serves as a gate contact for PMOS region 111*b*, so that a gate resistance for the PMOS region only includes RG2 instead of RG1+RG2. In various embodiments, a wider device is enabled at lower resistance than would occur if the contacts G[N], G[N-1], and G[N-2] were used to connect to the PMOS gate.

PMOS region 111*b* has M1 power supply (VDD) regions 150*k* and 150*l* and word line region 150*m*. Similar regions corresponding to word lines WL[N-1] and WL[N-2] are shown but not labeled for simplicity of illustration. Similarly, various other components of PMOS region 111*b* are analogous to those of NMOS region 111*a* and are not labeled but are readily understood by one of ordinary skill in the art.

As shown in FIG. 1, in some embodiments, M1 region 150*b* is configured to conform to a portion of a perimeter of M1 region 150*h*, e.g., routed around three sides (left, top, and right sides, referring to the orientation of FIG. 1) of the perimeter of the M1 region 150*h*. In other words, M1 region 150*b* "snakes around" M1 region 150*h*. With this snaking (serpentine) configuration, M1 region 150*b* is advantageously laid out without increasing a circuit footprint (area). In other embodiments, (not shown), the M1 WL patterns may be routed around two sides of the region 150*h* in a "dog leg" configuration having two long parallel segments connected by a perpendicular segment.

FIG. 2 is a cross-sectional view, at a section line 2-2 of FIG. 1, of word line driver 100. The cross-sectional view of FIG. 2 shows gate contacts G[N], G[N-1], and G[N-2] of FIG. 1. An interlayer dielectric (ILD) is above a substrate 105. Gate contact G[N] has poly gate conductors 120*a* and 120*b* (also denoted PO) on the substrate. Metal zero layer 130*a* is above the poly gate conductors 120*a* and 120*b* and is denoted M0_PO in FIG. 2. A via 140*a* is in the V0_ILD layer between the M0 ILD layer and M1 ILD layer and is on top of the circuit pattern of the M0 layer 130*a*. The circuit pattern of the M1 layer 150*b* is on top of the via.

Contacts 132 may have similar cross-sections as the gate contacts described above in the context of FIG. 2. Providing these contacts 132 reduces poly resistance in some embodiments, which improves overall timing performance.

Figure 3:
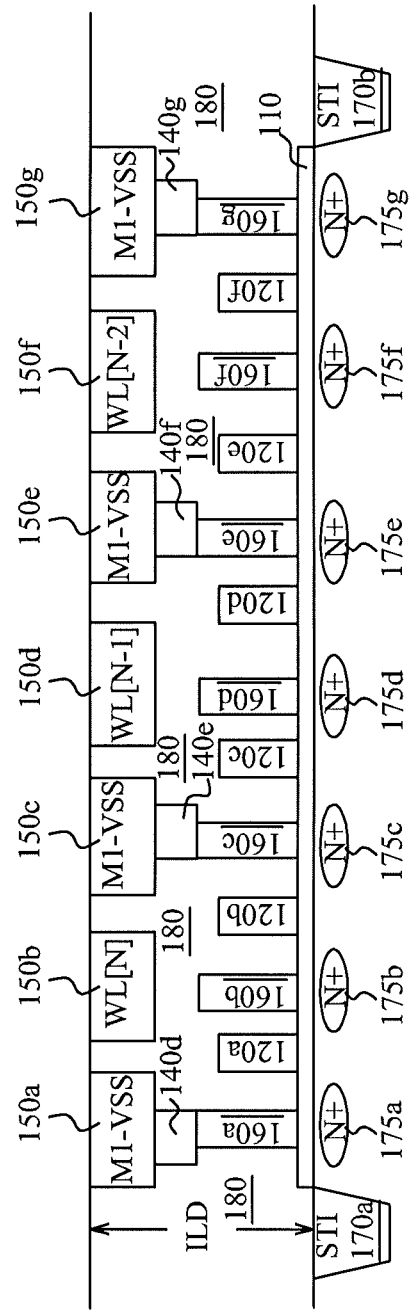
FIG. 3 is a second cross-sectional view, taken along section line 3-3 of FIG. 1, of a word line driver layout in accordance with some embodiments.

FIG. 3 is a cross-sectional view, at a section line 3-3 of FIG. 1, of word line driver layout 100. For convenience, elements in FIG. 3 corresponding to word line WL[N] are described in detail below, and elements corresponding to word lines WL[N-1] and WL[N-2] are labeled and understood by one of ordinary skill in the art to be similar to those described with reference to WL[N]. FIG. 3 shows doped regions (diffusions) 175*a-g* (collectively 175), which may be N-type diffusions. These diffusions may be heavily doped N+ diffusions. The cross-sectional view of FIG. 2 shows shallow-trench isolations (STIs) 170*a* and 170*b* at ends (e.g., top and bottom ends referring to FIG. 1) of NMOS region 111*a*. Metal zero oxide definition (M0_OD) regions 160*a* and 160*b* are above N+ diffusions 175*a* and 175*b*, respectively, with poly gate conductors 120*a* and 120*b* on either side of M0_OD region 160*b*. A via 140*d* is above M0_OD region 160*a*, and a metal one layer 150*a* having a reference voltage (M1-VSS) is on top of the via. Another M1-VSS layer 150*b* is also provided. Similar elements are provided for word lines WL[N-1] and WL[N-2], with like reference numerals assigned to like elements. These elements are understood by one of ordinary skill in the art with reference to the above description and do not require further description. In some embodiments, another cross-section taken at section line B3 of FIG. 1 is similar to the cross-section described above except that different vias (e.g., different from vias 140*d-g*) are present. In other words, referring to FIG. 1, in some embodiments two vias are positioned underneath M1-VSS 150*a* (these vias are not shown), with via 140*d* to the left of another via.

FIG. 4 is a cross-sectional view, taken along section line 4-4 of FIG. 1, of word line driver 100. For brevity, only elements differing from those of FIG. 3 are described in detail below. A circuit pattern 150*b* in the M1 layer is disposed above the M0_OD region 160*a* as shown in FIG. 4. A via 140*h* is above M0_OD region 160*b*, and a circuit pattern 150*h* in the M1 layer is above the via. Similar elements are provided for word lines WL[N-1] and WL[N-2], with like reference numerals assigned to like elements. These elements are understood by one of ordinary skill in the art with reference to the above description and do not require further description. In some embodiments, another cross-section taken along section line B4 of FIG. 1 is similar to the cross-section described above except that different vias (e.g., different from vias 140*h-j*) are present. For example, referring to FIG. 1, in some embodiments two vias are positioned underneath M1 layer 150*h* (these vias are not shown in FIG. 1), with via 140*h* to the left of another via.

Cross-sections of PMOS region 111*b* are similar to those described above in the context of FIGS. 2-4 regarding NMOS region 111*a*, as one of ordinary skill in the art understands; therefore, such PMOS cross-sections are not described in detail. PMOS region 111b has power supply (VDD) voltages instead of reference voltages (VSS) provided by metal one layers 150k and 150l.

FIG. 5 is a circuit schematic corresponding to a word line driver in accordance with some embodiments. Gate contact G[N] is coupled to gates of respective NMOS and PMOS transistors 190, 192 via poly circuit paths, which have parasitic resistances represented by resistors RG1, RG2. An M1 VSS layer, e.g., M1 VSS layer 150a, is connected to the source side of NMOS transistor 190, and an M1 VDD layer, e.g., M1 VDD layer 150k, is connected to the source side of PMOS transistor 192. Word line WL[N] is provided at a node coupling the drains of transistors 190 and 192. The effective resistance for the PMOS region is RG2, as opposed to RG1+RG2 with known techniques, because metal one layer 150b that passes through NMOS region 111a is directly connected to the PMOS region 111b. The circuit patterns in the M1 layer may be copper formed by a damascene process, which has a lower resistance than the poly gate conductors 120a, Thus, by coupling a gate contact (e.g., gate contact G[N]) to PMOS region 111b via a high-conductivity metal at M1 layer 150b, PMOS region 111b is not dependent upon poly gate conductors 120a for the electrical connection (which would correspond to a larger resistance of RG1+RG2, with the parasitic resistances in series).

In some embodiments, a metal gate has a resistance of 150 ohm/sqr, a length of 0.75 μm, and a width of 20 nm for 0.172 μm word line pitch. The gate resistance may be 150*(0.75 μm/20 nm)=5.6 kOhms. In some embodiments, a metal one layer has a minimum width of 0.032 μm and may have a width of 0.042 μm.

A zigzag configuration as in various embodiments reduces gate resistance and thus increases circuit speed, because speed is largely influenced by an RC (resistance multiplied by capacitance) delay. In some embodiments, a speed improvement of about 25% relative to known techniques is enabled. More particularly, timing characteristics of some embodiments are detailed in Table 1 below.

TABLE 1

|  | Known WL driver (no zigzag and no gate resistance improvement) | WL driver in accordance with various embodiments having gate resistance improvement | % timing improvement |
| --- | --- | --- | --- |
| WL[N] rise delay (s) | 1.255e−10 sec | 9.338e−11 sec | 25.75% |
| WL[N] fall delay (s) | 9.892e−11 sec | 7.282e−11 sec | 26.31% |

Thus, various embodiments solve a high gate resistance challenge associated with 20 nm technology without incurring an area penalty, because the zigzag pattern fits within an existing footprint.

Although examples are illustrated and described herein, embodiments are nevertheless not limited to the details shown, since various modifications and structural changes may be made therein by those of ordinary skill within the scope and range of equivalents of the claims.

What is claimed is:

1. A semiconductor device comprising:
   a gate conductor formed above an oxide region over a substrate, the gate conductor having a contact;
   a second conductor coupled to the contact and extending across a width of the oxide region, the second conductor having a lower resistance than the gate conductor; and
   a third conductor that is a word line conductor;
   wherein the second conductor is routed to not intersect the word line conductor.

2. The semiconductor device of claim 1, further comprising a fourth conductor capable of being connected to a voltage node having a predetermined voltage, wherein the second and fourth conductors are formed in the same layer as each other.

3. The semiconductor device of claim 1, further including a fifth conductor and a sixth conductor formed of a same material as each other, the fifth and sixth conductors formed at a first metal layer above the oxide region, the fifth conductor coupled to the fourth conductor by a first via.

4. The semiconductor device of claim 3, wherein the word line conductor is coupled to the sixth conductor by a second via.

5. The semiconductor device of claim 3, wherein the second conductor and the word line conductor are formed at a second layer higher than the first layer.

6. The semiconductor device of claim 1, wherein the second conductor is routed in a zigzag configuration around the word line conductor.

7. The semiconductor device of claim 1, wherein the second conductor is configured to conform to three sides of the word line conductor.

8. The semiconductor device of claim 1, wherein the second conductor is formed from copper.

9. The semiconductor device of claim 1, wherein the second conductor is formed in an interlayer dielectric material above the gate conductor in the oxide region.

10. A word line driver comprising:
    a first gate contact comprising a first conductor;
    an NMOS transistor comprising an NMOS oxide region, the NMOS transistor coupled to the gate contact;
    a PMOS transistor comprising a PMOS oxide region, the PMOS transistor coupled to the NMOS transistor; and
    a word line provided at respective drains of the NMOS and PMOS transistors by respective second and third conductors that are word line conductors, the word line conductors formed at a same metal layer as the first conductor;
    wherein the first conductor extends across a width of the NMOS oxide region and a width of the PMOS oxide region and is routed to not intersect the word line conductors.

11. The word line driver of claim 10, further including a second gate contact between the NMOS and PMOS transistors, the second gate contact coupled to the first conductor by a via.

12. The word line driver of claim 10, wherein the first conductor is formed from copper.

13. The word line driver of claim 10, wherein the first conductor is formed in an interlayer dielectric material above a fourth conductor in the NMOS and PMOS oxide regions.

14. The word line driver of claim 10, wherein the NMOS transistor includes a fourth conductor capable of being connected to a reference voltage at a source of the NMOS transistor, and the PMOS transistor includes a fifth conductor capable of being connected to a power supply voltage at a source of the PMOS transistor.

15. The word line driver of claim 14, wherein the fourth and fifth conductors are formed at the same metal layer as the first, second, and third conductors.

16. The semiconductor device of claim 14, wherein the first conductor is routed in a zigzag configuration to conform to three sides of each word line conductor.

17. A semiconductor device comprising:
    a plurality of doped regions formed in a substrate;

an oxide region over the substrate;

an interlayer dielectric layer over the oxide region;

first and second conductors disposed on the oxide region, the first and second conductors disposed above respective first and second doped regions among the plurality of doped regions;

a third conductor that is a word line conductor coupled to the second conductor by a first via; and a fourth conductor formed in the interlayer dielectric layer, the fourth conductor extending across a width of the oxide region, the fourth conductor routed to not intersect the word line conductor.

18. The semiconductor device of claim 17, further comprising a fifth conductor coupled to the first conductor by a second via; wherein the fifth conductor is capable of being connected to a voltage node having a predetermined voltage.

19. The semiconductor device of claim 17, wherein the first and second conductors are formed in a first metal layer, and the third and fourth conductors are formed in a second metal layer above the first metal layer.

20. The semiconductor device of claim 17, wherein the fourth conductor is routed in a zigzag configuration around the word line conductor.

\* \* \* \* \*